US006456899B1

(12) United States Patent
Gleason et al.

(10) Patent No.: US 6,456,899 B1
(45) Date of Patent: Sep. 24, 2002

(54) CONTEXT-BASED AUTOMATED DEFECT CLASSIFICATION SYSTEM USING MULTIPLE MORPHOLOGICAL MASKS

(75) Inventors: Shaun S. Gleason, Knoxville, TN (US); Martin A. Hunt, Knoxville, TN (US); Hamed Sari-Sarraf, Lubbock, TX (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

(21) Appl. No.: 09/454,568

(22) Filed: Dec. 7, 1999

(51) Int. Cl.[7] .............................................. G06F 19/00
(52) U.S. Cl. ........................ 700/212; 700/110; 706/900
(58) Field of Search ................................ 700/121, 165, 700/166, 164, 108, 109, 110, 115, 204; 382/149, 159; 706/900; 250/310

(56) References Cited

U.S. PATENT DOCUMENTS

| 5,544,256 A | | 8/1996 | Brecher et al. ............. 382/149 |
| 5,943,437 A | | 8/1999 | Sumie et al. ............... 382/149 |
| 6,259,960 B1 | * | 7/2001 | Inokuchi ..................... 250/306 |
| 6,288,782 B1 | * | 9/2001 | Worster et al. ............. 356/394 |
| 6,292,582 B1 | * | 9/2001 | Lin et al. .................... 382/149 |
| 6,314,379 B1 | * | 11/2001 | Hu et al. ..................... 700/110 |

OTHER PUBLICATIONS

J.R.Dralla, J.C.Hoff, "Automatic Classification of Defects in Semiconductor Devices," SPIE Conf. on Integrated Circuit Metrology, Inspection & Process Control IV, vol. 1261, 1990.

Jatko, W. B., et al, "Nonlinear Filter Derived from Topological Image Features," Intl. Soc. for Optical Eng. Conf., Orlando, FL, Apr. 16, 1990.

Gleason, S. S., et al, "Subpixel Measurement of Image Features Based on Paraboloid Surface Fit.," Intl. Soc. for Optical Eng. Conf., Boston, MA, Nov. 1990.

Sherman, R. et al, "An Automatic Defect Classification System for Semiconductor Wafers," SPIE Conf. on Machine Vision Applications in Industrial Inspection, vol. 1907, 1993.

* cited by examiner

Primary Examiner—Leo Picard
Assistant Examiner—Kidest Bahta
(74) Attorney, Agent, or Firm—James M. Spicer

(57) ABSTRACT

Automatic detection of defects during the fabrication of semiconductor wafers is largely automated, but the classification of those defects is still performed manually by technicians. This invention includes novel digital image analysis techniques that generate unique feature vector descriptions of semiconductor defects as well as classifiers that use these descriptions to automatically categorize the defects into one of a set of pre-defined classes. Feature extraction techniques based on multiple-focus images, multiple-defect mask images, and segmented semiconductor wafer images are used to create unique feature-based descriptions of the semiconductor defects. These feature-based defect descriptions are subsequently classified by a defect classifier into categories that depend on defect characteristics and defect contextual information, that is, the semiconductor process layer(s) with which the defect comes in contact. At the heart of the system is a knowledge database that stores and distributes historical semiconductor wafer and defect data to guide the feature extraction and classification processes. In summary, this invention takes as its input a set of images containing semiconductor defect information, and generates as its output a classification for the defect that describes not only the defect itself, but also the location of that defect with respect to the semiconductor process layers.

28 Claims, 5 Drawing Sheets

Full Defect Mask 26

Edge Defect Mask 29

Surround Defect Mask 30

CONTEXT-BASED AUTOMATED DEFECT CLASSIFICATION SYSTEM USING MULTIPLE MORPHOLOGICAL MASKS

This invention was made with Government support under contract No. DE-AC05-96OR22464 awarded by the United States Department of Energy to Lockheed Martin Energy Research Corporation, and the Government has certain rights in this invention.

FIELD OF THE INVENTION

The invention relates generally to methods for semiconductor defect detection and classification. More particularly, the invention relates to a digital computer system for carrying out defect detection and defect classification operations in one automated system. The system also utilizes multiple defect masks and multiple focus planes in the defect feature extraction process.

BACKGROUND OF THE INVENTION

The automatic detection of defects during the fabrication of semiconductor wafers is largely automated, but the classification of those defects is in many cases still performed manually by technicians. Projections by semiconductor manufacturers are that with larger wafer sizes and smaller line width technology, the number of defects to be manually classified will increase exponentially. While humans are adept at classifying suspect defects, modem automated wafer inspection systems are already detecting 50,000 to 100,000 defects a day. In an attempt to reduce the volume of defects that must be investigated manually, ways are being sought to further automate the defect identification and classification processes.

In our invention, the semiconductor defect classification is based on the features of the defects themselves and also on their location with respect to process layers of the semiconductor wafer. By combining both defect features and defect location (context) features, our invention makes possible the correct classification of many types of semiconductor defects, and it allows the manual investigations as to the source of the defects to be carried out more quickly and accurately.

SUMMARY OF THE INVENTION

It is an object of the invention to provide an automated semiconductor wafer defect classification system that classifies defects based on a combination of their location with respect to process layers of the semiconductor wafer and the defect characteristics.

It is another object of the invention to provide an automated semiconductor wafer defect classification system that uses region classification based on defect edge information and intensity content.

It is another object of the invention to provide an automated semiconductor wafer defect classification system that decreases wafer inspection time, improves the reliability of the defect classification, and thereby increases the process throughput and yield.

It is another object of the invention to provide an automated semiconductor wafer defect classification system that incorporates image analysis, feature extraction, and pattern recognition and classification methods.

It is another object of the invention to provide an automated semiconductor wafer defect classification system that utilizes image segmentation and feature extraction in the presence of semi-regular background texture.

It is another object of the invention to provide an automated semiconductor wafer defect classification system that utilizes new defect features for better differentiating between defect types and classes.

It is another object of the invention to provide an automated semiconductor wafer defect classification system that utilizes feature extraction methods based on fractal dimension, multiple-focus imagery, multiple colorspace, and multiple defect mask implementations.

The present invention utilizes a digital computer for automatically classifying defects in a semiconductor wafer and comprises a means for identifying the background layers in a reference semiconductor wafer image resulting in a layer identification image, a means for registering a defect semiconductor wafer image to the reference semiconductor image and subsequently detecting a defect in the defect semiconductor image, a means for classifying the detected defect using features of the defect, a database for storing precomputed information and sharing information between the background layer identifying means and the detected defect classifying means, and a means for associating the classified detected defect with the layer identification image resulting in a context-based classification of the defect.

DESCRIPTION OF THE PREFERRED EMBODIMENTS

Figure 1:
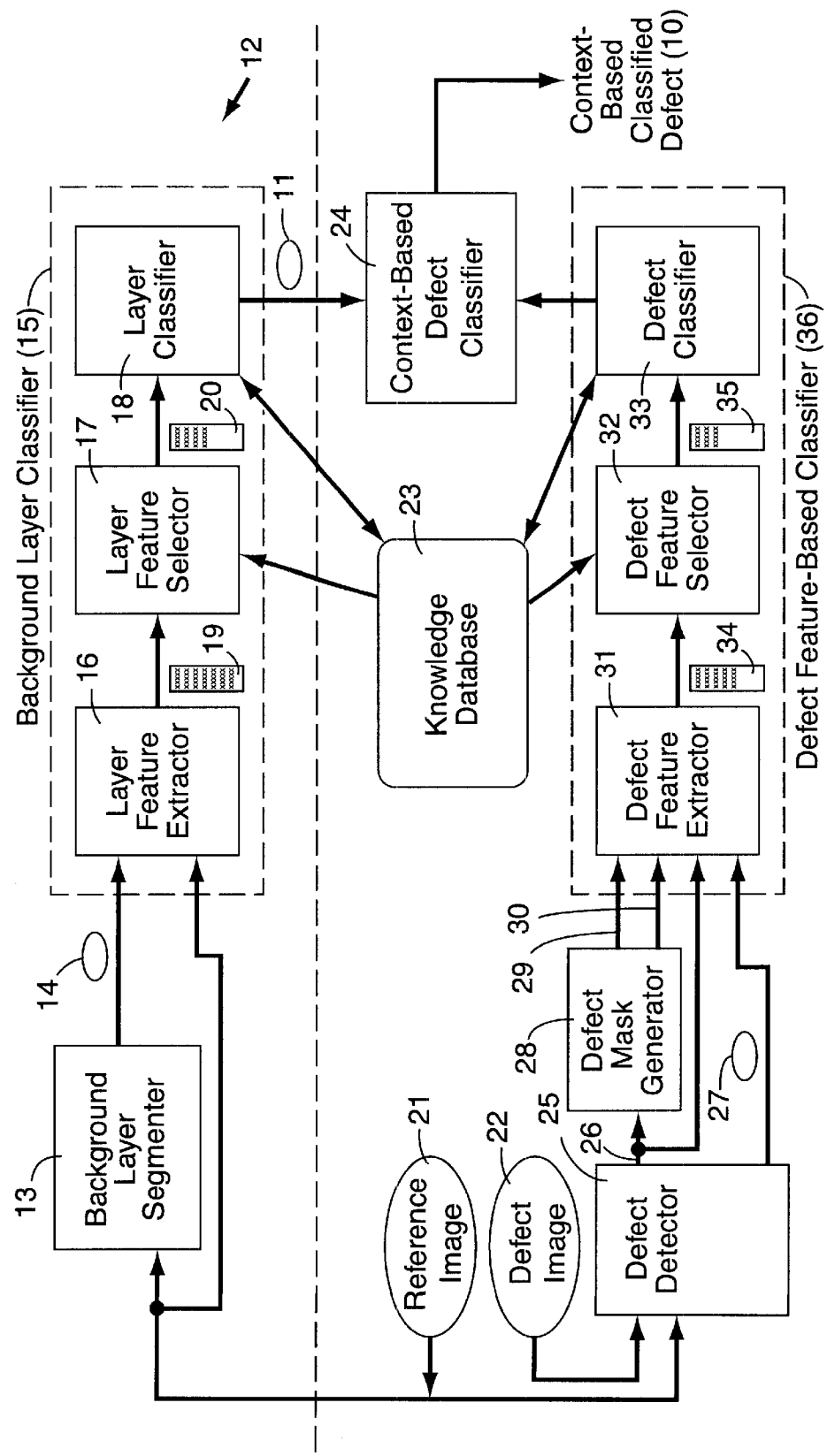
FIG. 1 is a block diagram of a first embodiment of the automated defect classification system of the present invention.
Figure 2:
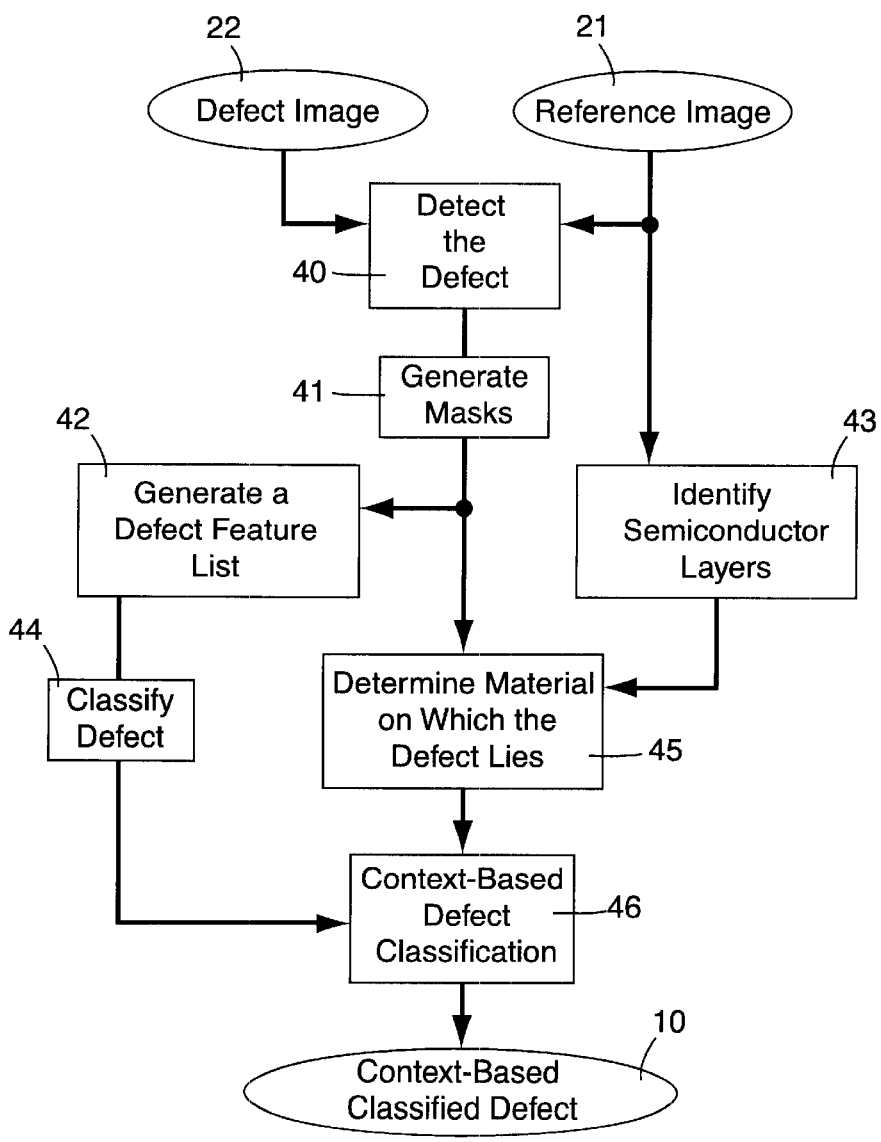
FIG. 2 is a flow chart illustrating the method for automatically classifying a defect according to the present invention.

As shown in FIGS. 1 and 2, the inputs to the overall system are a color reference image 21 and a color defect image 22. The reference and defect images can be captured at multiple focus offsets including a required in-focus (in the semiconductor plane), and optional above-the focal plane (positive focus offset), and below-the focal plane (negative focus offset). The images correspond to a region in a reference semiconductor chip, and the identical region in a second semiconductor chip undergoing inspection. The defect image 22 is characterized by the presence of one or more defects in it. Both the reference image 21 and defect image 22 can be generated, for example, by any of several in-line defect inspection systems such as optical microscopes, scanning electron microscopes (SEM), or laser scattering systems as are commonly employed by semiconductor manufacturers. A second input to the overall system is the knowledge database 23, which contains information generated in an off-line training exercise. This information includes classifier configuration parameters and discriminatory feature rankings, for example.

The top part of FIG. 1 shows a background layer identification means, indicated at reference numeral 12. The background layer identifier 12 carries out a process for segmenting and identifying the regions and the layers present within the semiconductor reference image 21.

In a first embodiment of the invention, shown in FIG. 1, the background layer identification means 12 comprises a background layer segmenter 13 and background layer classifier 15. The modules 13 and 15 are used to perform background layer classification using image intensity analysis. In a second embodiment of our invention, shown in FIG. 1A, the background layer identification means is indicated by reference numeral 12'. It comprises a hue, saturation and value (HSV) data extractor 7 and a neural network layer classifier 8. Prior to this invention being applied, the user will select one method or the other (12 or 12'), depending on which works best for their application. Once this selection is made, the system runs in fully automatic mode. Each embodiment will be described separately.

The bottom part of FIG. 1 is common to both embodiments of our invention, and comprises a defect detector 25, defect mask generator 28 and defect feature-based classifier 36. These modules are used to locate and classify the defect within the defect image 22. These and all the other modules of the invention, described in more detail below, are implemented in software.

In the first embodiment of our invention shown in FIG. 1, the background layer segmenter 13 accepts the reference image 21 as input. The purpose of the background layer segmenter is to segment, or divide, the reference image into different physical regions where each region corresponds to a different layer of semiconductor material such as metal or polysilicon. The term layer implies different materials within the semiconductor such as metal layers or field layers. The output of the background layer segmenter is a second image, the segmented reference image 14, whose pixels have been given a numeric tag. This tag categorizes all pixels with similar intensity characteristics into the same group. Each group of pixels will eventually be classified and given a label corresponding to a particular material on the semiconductor wafer.

Figure 3:
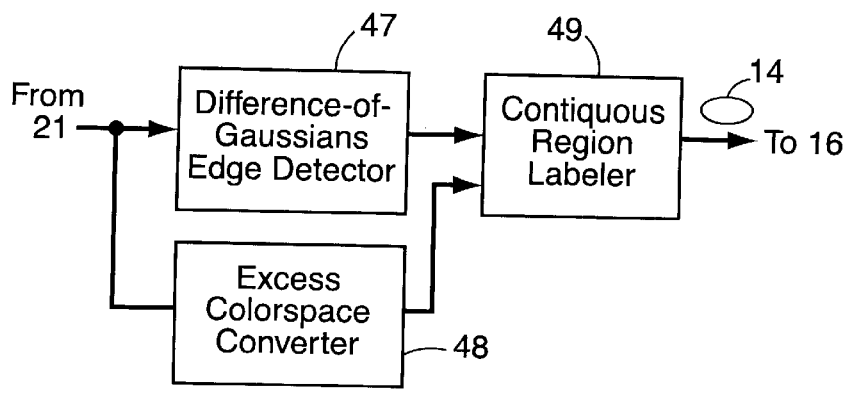
FIG. 3 is a block diagram of a background layer segmenter used in the present invention.

FIG. 3 shows the background layer segmenter 13 in more detail. It includes a difference-of-Gaussians edge detector 47 which carries out edge extraction using a difference-of-Gaussians method; an excess colorspace converter 48 which transforms the intensity values of the reference image; and a continuous region labeler 49 which segments the regions based on edge boundaries, image intensity measurements, adaptive thresholding, and finally a morphological closing process that results in the segmented reference image 14.

In FIG. 1, the background layer classifier 15 comprises the layer feature extractor 16, layer feature selector 17, and layer classifier 18. The layer feature extractor 16 takes the segmented reference image 14 from the background layer segmenter 13 as one input, and the reference image 21 as a second input. The layer feature extractor 16 measures characteristics or features about each one of the segmented regions in the reference image using the segmented image as a map of where to make measurements. For example, texture, color, or fractal dimension may be measured. The output of the layer feature extractor 16 is a table of numbers, or layer features 19, that represent feature characteristics per reference image region. If the segmented reference image 14 had four different regions identified by the background layer segmenter 13, then the layer feature extractor 16 would measure, via image processing algorithms, features about each one of those four different regions. The segmented reference image 14 is used as a map to decide where to go in the reference image 21 to make its measurements.

The information from the layer feature extractor 16, i.e., the table of layer features 19, is input to the layer feature selector 17. The layer feature selector 17 pares down this table of over-specified features into a meaningful, i.e., useful, subset of discriminatory features. Thus, the input is the table of layer features 19, and the output is a pared down list of discriminatory layer features 20. The layer feature selector 17 retrieves the appropriate list of discriminatory features from the knowledge database 23 based on the format of the current semiconductor product under inspection. The knowledge database 23 contains a precomputed list of the discriminatory layer features for a given semiconductor wafer format. It uses simple statistical measurements (ratio of difference-of-mean to sum-of-variance) to precompute which features have discriminatory power (i.e., can be used to distinguish one layer from another).

The discriminatory layer features 20 generated by the layer feature selector 17 are input to the layer classifier 18. It takes the input list of discriminatory layer features 20, and classifies each layer according to its feature characteristics. The layer classifier 18 assigns a label to each region of the reference image 21 based on its layer classification, i.e., metal, polysilicon, etc. To make a classification decision for each region, the layer classifier 18 accesses the knowledge database 23, and compares its list of features to a collection of pre-labeled feature lists in the database 23 to see which one it best matches. The historical information (prelabeled feature lists) in the knowledge database 23 would have been entered prior to system operation by an expert operator. The output of the layer classifier 18 is a layer identification image 11, which is input to a context-based defect classifier 24.

Figure 4:
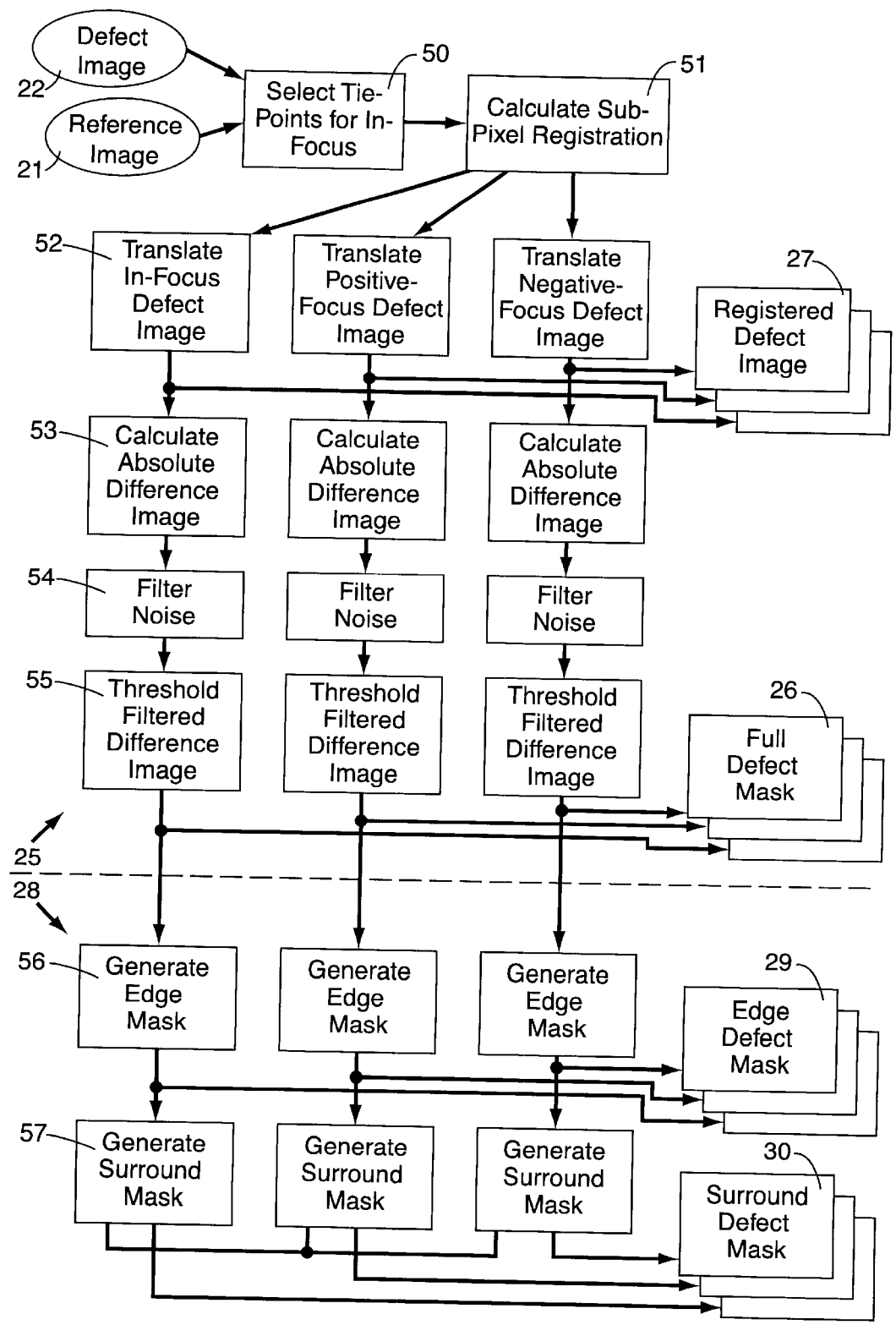
FIG. 4 is a block diagram of a defect detector and defect mask generator used in the present invention.

Referring now to the bottom part of FIG. 1, and to FIG. 4, the defect detector 25 takes as its input both the reference image 21 and the defect image 22. Two outputs are produced by the defect detector 25. The first of these is the detected defect in the form of a full defect mask 26 that identifies the region within the defect image 22 where the defect is located. The second is the registered defect image 27 which is generated as a result of spatially aligning the defect image 22 with the reference image 21.

Figure 5A:
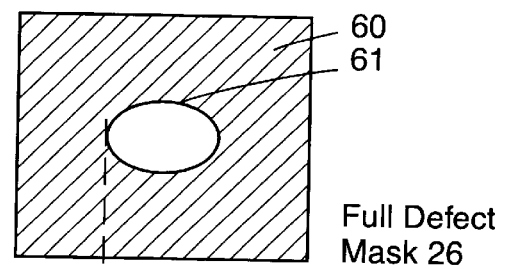
FIGS. 5A–5C are representations of three defect masks generated in the invention.
Figure 5B:
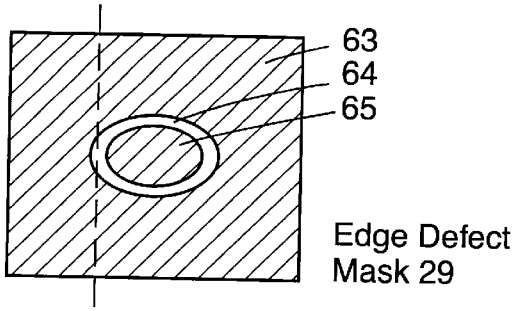
Figure 5C:
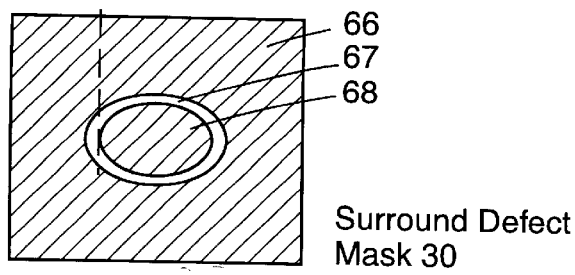

As shown in FIG. 1, and in more detail in FIG. 4, the input to the defect mask generator 28 is the full defect mask 26, and the output is two masks; an edge defect mask 29, and a surround defect mask 30. Using standard morphological processing techniques of erosion and dilation, the full defect mask 26 is processed to generate the edge and surround defect masks 29, 30. Referring to FIGS. 5A, 5B and 5C, the crosshatched part of the three masks correspond to the masks themselves, that is, to what is excluded from further processing. The three masks, 26, 29, 30 are passed to the defect feature extractor 31 in the defect feature-based classifier 36.

The defect feature extractor 31 is similar to the layer feature extractor 16. The defect feature extractor 31 contains a set of preprogrammed feature extraction algorithms that generate a feature list 34. The defect feature extractor's function is to take the three masks 26, 29, 30 and overlay them onto the registered defect image 27 to identify the pixels in the registered defect image where the user wants to measure features. The defect feature extractor 31 then measures features of the suspect areas as identified by the three masks. Features such as intensity, texture, size, etc., are measured via algorithms and then passed on to the defect feature selector 32.

The next component of the defect feature-based classifier 36 is the defect feature selector 32. It takes as its input the list of defect features 34, and pares that list down into a selected set of features 35. The defect feature selector 32 pares down the feature list 34 by accessing the knowledge base 23 and retrieving a list of existing discriminatory features for the current semiconductor device under inspection. This list of discriminatory defect features 34 is then passed on to the defect classifier 33.

Similar to the layer classifier 18, the defect classifier 33 takes the selected set of defect features 35 as its input, interacts with the knowledge database 23 to pull out classifier training information, and makes a decision about what category of defect the list of input features describes. The category of defect could be a dust particle, resist flake, or extra pattern, for example. The output of the defect classifier 33 is a class label that identifies the most likely category of the detected defect, and it is passed on to the context-based defect classifier 24.

The output of the defect classifier 33 and the output of the background layer identifier 12 (background layer classifier 15 for embodiment#1 or, alternatively, neural network layer classifier 8 for embodiment#2) go into the context-based defect classifier 24. The function of the context-based defect classifier 24 is straightforward. It determines the category of the layer upon which the detected defect lies, and then associates this information with the defect classification information from the defect classifier 33, resulting in the context-based classified defect 10. For example, if the defect that was identified by the defect classifier 33 is a dust particle, and the layer upon which the defect lies was identified by the background layer classifier 15 as a metal layer, the context-based defect classifier 24 will call the classified defect "dust particle on metal layer."

FIG. 2 illustrates the major operative steps of our method. It involves the mathematical manipulation of pixel data in the acquired reference and defect images 21, 22, and utilizes stored information in the knowledge database 23 to derive a useful classification of the type of defect contained in the defect image 22. The individual steps performed to accomplish the final context-based defect classification are described in the following sections.

In FIG. 2, reference numeral 43 refers to the identification of the semiconductor layers present in the color reference image 21. The semiconductor layer identification operation 43 is accomplished using a series of steps that first partition the entire reference image into regions with similar intensity attributes, and then designates those regions with a specific semiconductor label.

In the first of these steps, in the background layer segmenter 13, mathematical expressions are used that estimate the gradient of the gray scale intensity values within the reference image 21 to delineate boundaries, or edges, between dissimilar regions. We have used a difference of Gaussians algorithm because of the ability to tune the size of the Gaussian filter functions based on the relative size of the semiconductor geometry and the resulting connected edge boundary line. Other methods such as the Canny or Sobel operators could be used for the basic edge detection followed by a linking of the resulting edge segments into a continuous region boundary. Once the boundaries between regions are established, a unique tag is assigned to each pixel within a given connected region. The image 14 that results is a segmented representation of the input reference image 21.

The next step in identifying the semiconductor layers in the reference image is to classify the segmented regions of the image 14. In the layer feature extractor 16, a colorspace conversion is performed on the original three channel (red, green, and blue) reference image 21 on a pixel-by-pixel basis. This conversion generates images identified as the "excess" color representation. The "excess red" measurement is made by taking two times the red pixel value and subtracting the blue and green pixel values. Similarly, the "excess blue" measurement is made by taking two times the blue pixel value and subtracting the red and green pixel values.

Next, in the layer feature extractor 16, first order statistics such as mean and variance are computed for each of the tagged regions in the reference image using the three "excess" images as the data source for the statistical computation. Other numerical descriptors such as fractal dimension and texture are computed for each tagged region using the gray scale intensity reference image as the data source. The result of these computations is a table of values 19 in which the rows represent each tagged region in the reference image and the columns represent the numerical results of a mathematical operator performed on the pixel data contained in the respective regions. Each cell in the table 19 is referred to as a feature, and the complete row is a feature list for a given region.

Next, in the layer feature selector 17, columns of features from the table 19 are selected using information stored in the knowledge database 23. The stored information is information that had been previously generated in an off-line training and analysis procedure. The layer feature selector 17 then performs statistical analysis on the training features, and each feature is ranked based on its ability to discriminate between possible classes. The information in the database 23 is considered a recipe generated for a specific set of operating conditions, e.g., wafer size, processing step, geometry. The new list of features 20 that is generated from this selection is a subset, or possibly all, of the original features 19.

The final step in the layer identification operation 43 is the classification of the segmented regions of the reference image by the layer classifier 18. Each segmented region is assigned a semiconductor layer type based on the output of the layer classifier 18. The layer classifier 18 is a mathematical operation that takes as its input a single row in the feature list 20 and generates an output corresponding to a layer. Any number of classifiers could be used for this step including Fisher pairwise, neural network, or nearest neighbor. In each of these classifiers, a training process is used to generate a mathematical relationship between the input features and the output classification value. The results of the training process would have been stored in the knowledge database 23 and used to classify an unknown segmented region during the defect identification operation. Each classifier defines a measure of similarity between feature lists, and selects the layer class that maximizes the measure of similarity, Euclidian distance, for example.

The remaining operative steps of our invention have to do with the defect detection and classification process, and are common to both embodiments of our invention.

In operative step 40 of FIG. 2, defects in the input defect image 22 are detected by the defect detector 25 shown in FIG. 4. The method used is a pixel-by-pixel differencing operation with the reference image 21. The operation proceeds according to the following series of steps within defect detector 25: tie-point selection 50, sub-pixel registration and alignment 51, translation 52, differencing 53, filtering 54 and thresholding 55. The defect detection operation is performed on pairs of defect/reference images obtained at the three focus offsets described previously. The primary pair of input images are in-focus with respect to the nominal semiconductor surface, and the negative and positive focus offset pairs are focused below and above the nominal surface, respectively.

In FIG. 4, in the first step of the defect detection operation 40 is automatic tie-point selection 50. It is performed by searching for the maximum in the magnitude of the intensity gradient image, and using this coordinate location as a candidate tie-point. The magnitude of the intensity gradient image is approximated using a method such as the Sobel operator or Roberts's gradient applied to the in-focus reference image.

The next step, sub-pixel registration and alignment 51, involves computing the normalized correlation between a rectangular window centered at the tie-point in the reference image 21 and a larger rectangular window from the defect image 22. As the smaller reference window is translated across all possible locations in the defect window, a grid of results from the normalized correlation is generated. This grid of correlation values is used to determine the difference in alignment (translation of one image with respect to another) between the in-focus defect and reference images. A parabolic surface is fit to the maximum of the normalized correlation values and the immediate neighbors of the maximum in the grid. The numerical derivative of the parabolic surface is used to estimate the location of the true maximum. This process is described in greater detail in "Subpixel Measurement of Image Features Based on Paraboloid Surface Fit." (S. S. Gleason, M. A. Hunt and W. B. Jatko, Intl. Soc. for Optical Engineering Conf., Boston, Mass., November, 1990).

In the translation step 52, the alignment information derived in the sub-pixel operation 51 is used to translate the defect images from all the focus offsets. Several interpolation methods are available for calculating the intensity values of the translated input image including nearest neighbor, bi-linear, and higher order quadratics. This translated input image is the registered defect image 27.

The production of the registered defect image 27 completes the defect detection operation 40 and represents the first of two outputs produced by the defect detector 25. The other output is the full defect mask 26, produced as part of the mask generation step 41.

Still in FIG. 4, the full defect mask 26 is produced beginning with the differencing step 53. In step 53, once the defect image is spatially aligned with the reference image, the absolute difference between the pixels in each image is computed and stored in a difference image.

In the next step 54, slight differences in alignment and acceptable variations between the reference and defect images are removed from the difference image using filtering operation 54. The first filter applied is an edge attenuation operation based on the magnitude of the gradient of the reference image's intensity. This operation multiplies each pixel in the difference image by a factor that is inversely proportional to the magnitude of the gradient. This has the effect of reducing the residual artifacts generated due to slight differences in alignment. A subsequent nonlinear morphological filter is applied to the difference image to remove any remaining noise. This filtering process is described in greater detail in "Nonlinear Filter Derived from Topological Image Features." (Intl. Soc. for Optical Engineering Conf., Orlando, Fla., Apr. 16, 1990).

The final step 55 in the operation of the defect detector 25 is thresholding the pixel intensities in the filtered difference image. The thresholding step segments the defect areas from the input defect image. In FIG. 5A, all pixels with intensities above a set value are considered part of the defect, and are labeled with a white pixel value 61. The remaining pixels are given a black value 60. This resulting output from the defect detector 25 is the full defect mask 26.

The mask generation operation 41 continues with the production of two additional masks, both of which are generated by the defect mask generator 28 using as input the full defect mask 26 from the defect detector 25. These are the edge defect mask 29 and surround defect mask 30 shown in FIGS. 5B and 5C. It is the production of the three masks 26, 29 and 30 that comprise the mask generation operation 41.

In the defect mask generator 28, the edge defect mask 29 is generated by logically combining (exclusive OR) two processed versions of the full defect mask. These two images are generated by applying a morphological erosion and a dilation, respectively, on the full defect mask 26. The resulting edge defect mask 29 has white pixels located on the edge of the detected defect 64 and black pixels everywhere else (63 and 65).

The surround defect mask 30 is generated in the defect mask generator 28 in a similar manner. A logical operation (exclusive OR) is performed on the full defect mask 26 and a dilated version of the full defect mask. The result is a mask with white pixels 67 at the locations just outside and in the local region of the detected defect and black pixels everywhere else (66 and 68).

As FIG. 4 shows, the defect detection and mask generation operations 40, 41 are applied to all three different focus offset images. The alignment between the defect image and the reference image need only be determined for the in-focus pair, and this result can be used to align the off-focus pairs.

Figure 6:
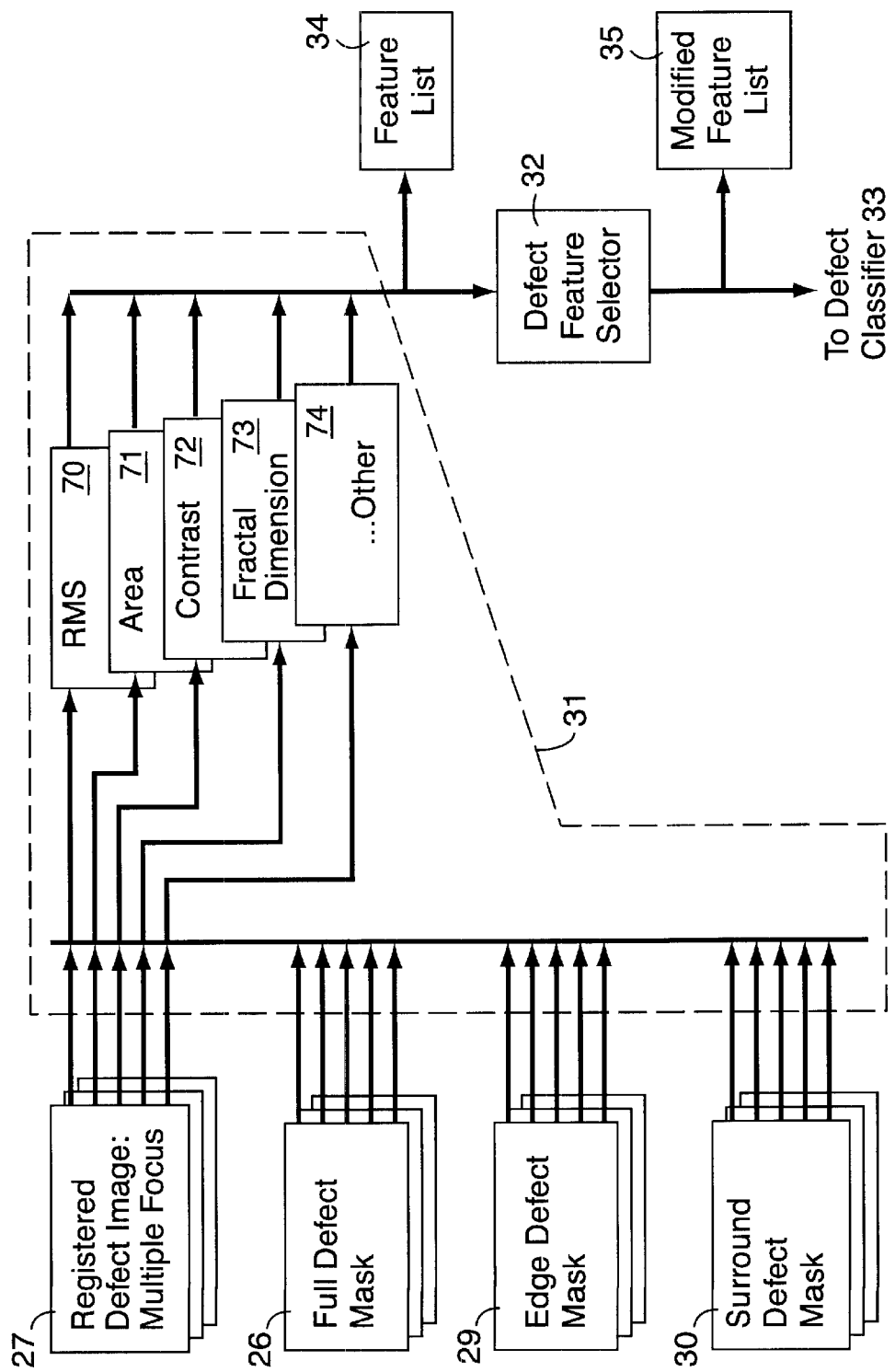
FIG. 6 is a representation of a defect feature extractor used in the invention.

In FIG. 6, the next operative step 42 of our invention is that of defect feature list generation carried out in the by the defect feature extractor 31. It involves the extraction of information from the pixel data that describes the defect in numerical representation. These numerical representations are named features. The feature generation operation 42 applies mathematical formulas to the pixel data in the input images (e.g., registered defect image 27, intensity gradient of the defect image, etc.) at locations where the masks have a white value. Specific attributes of the defect such as edge roughness and surround texture, for example, are isolated using the masks to extract pixel values in locations geometrically related to the morphology of the defect.

Two groups of features are extracted from each of the possible input defect images (multiple focus offset, and color). The first group is based on the shape or morphology of the full defect mask 26. Various numerical descriptors can be computed from the mask including area, centroid, higher order moments, compactness, elongation, orientation, etc.

The second group of features is based on the intensity values of selected pixels in the input images and magnitude of the intensity gradient. This operation proceeds by selecting valid pixels, and then using this set in the mathematical formula defining the given feature. Each mask is selected, and a set of pixels from the target image (e.g., registered defect image, intensity gradient of the defect image, etc.) is extracted at locations which correspond to the white values in the mask. This set is then used in the feature formula to arrive at a single value for that particular combination of target image, mask, and feature. A simple example of a mathematical operation that might be used is the arithmetic average of the input set of pixel values. More complicated operations include moments of the pixel value distribution, fractal dimension, and texture. The result of applying a suite of mathematical operators 70–74 to the all the possible permutations of the input images and the masks is the defect feature list 34 describing the actual defect.

The defect feature list 34 contains many features, and the usefulness of each individual feature for a given situation is determined in a feature selection operation using the defect feature selector 32. Statistical measures similar to those described for module 17 are employed to determine a ranking of the possible features. Information from the knowledge database 23 is used to select which specific features to pass to the defect classifier 33. This process is performed to eliminate information that does not contribute to the differentiation between different defect classifications. The resulting subset of features 35 is used for the classification of the defect.

The next operative step, defect classification 44, uses the defect classifier 33. The classification operation 44 uses the mask generation and defect feature selection results from the defect feature selector 32 as input, and assigns the candidate defect to a group of possible defect types. This classification operation proceeds by determining the closest match of an unknown feature to a set of representative features from each possible class. The definition of closest is a mathematical relation defining distance in a multi-dimensional vector space. An example of a specific classifier is a k nearest neighbor (KNN). This classifier uses Euclidean distance as the measure of closeness and assigns an unknown defect to the class that contains the majority of its k closest neighbors. In most classifiers, the input feature list is normalized based on either the global extremes or a statistical measure of the variation in the feature values. Any classification algorithm may be used at this step of processing as long as it maps an input feature onto a set of possible defect classes.

The next operative step 45 is determining the material on which the defect lies, and the context-based defect classifier 24 is used. In the context-based defect classifier 24, a logical AND operation is performed between the full defect mask 26 and the layer identification image 11 to determine the semiconductor layers that the defect overlays. This operation results in an image map that contains layer labels only at the location of the defect. Connected component analysis is performed to determine if the defect overlays one or more actual semiconductor layers and the extent of coverage on each layer. This information is passed on to the context-based defect classification operation 46.

The final operation is context-based defect classification 46, and this takes place in the context-based defect classifier 24. Module 24 generates a completely classified defect by combining the results from the defect location with respect to the process layer operation and the defect classification operation. This is accomplished by associating the input information using a simple rule set. Specific conditions such as a particle in field layer may be benign, whereas a particle spanning two metal layers or in an active area would be a potential killer. These conditions can be identified in the combination rule logic of the context-based classification operation. The final result from the context-based defect classification 46 is the context-based classified defect 10 in the form of a code and text string describing the given input defect in terms of its location with respect to the process layer and its class.

Figure 1A:
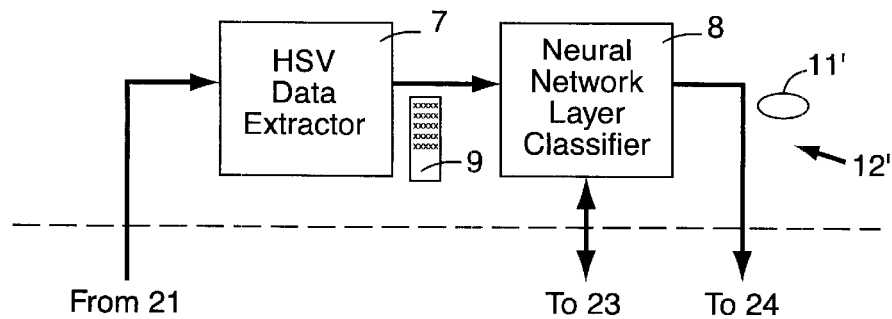
FIG. 1A is a block diagram of a second embodiment of the automated defect classification system of the present invention.

The second embodiment of our invention is shown in FIG. 1A. In this embodiment, the background layer identification means 12 of FIG. 1 is replaced with the background layer identification means 12' of FIG. 1A. In FIG. 1A, a hue, saturation and value data extractor 7 and a neural network layer classifier 8 perform the layer segmentation and identification. The final user of the system would choose which layer segmentation and identification means (12 in FIG. 1, or 12' in FIG. 1a) which works best for their application.

In the operation of the second embodiment, the layer identification operation 43 is carried out as follows. The reference image 21 is input to the HSV data extractor 7 where hue (H), saturation (S) and value (V) measurements are extracted for each pixel in the image, resulting in one list of HSV features per pixel 9. The HSV feature list 9 is then passed to the neural network layer classifier 8 where each pixel of the reference image 21 is classified as belonging to a specific semiconductor layer using information from the knowledge database 23. The neural network layer classifier 8 would have been previously trained using a manually labeled reference image. The output of the neural network layer classifier 8 is the layer identification image 11' which is input to the context-based defect classifier 24.

While there has been shown and described what are at present considered the preferred embodiments or variations of the invention, it will be obvious to those skilled in the art that various changes and modifications can be made therein without departing from the scope of the invention. Accordingly, it should be understood that the examples and embodiments described herein are for illustrative purposes only and that various modifications or changes will be suggested to persons skilled in the art, and that they are included within the spirit and purview of this invention. It is also understood that the invention can take other specific forms without departing from its spirit or essential attributes.

We claim:

1. A digital computer for automatically classifying defects in a semiconductor wafer comprising:

means for identifying the background layers in a single reference semiconductor wafer image resulting in a layer identification image, said background layer identifying means including a background layer segmenter for dividing said reference semiconductor wafer image into different physical regions, said background layer identifying means further including a background layer classifier for classifying said physical regions of said reference semiconductor wafer image;

means for registering a defect semiconductor wafer image to said reference semiconductor image and subsequently detecting a defect in said defect semiconductor image;

means for classifying said detected defect using features of said defect;

a database for storing precomputed information and sharing information between said background layer classifier and said detected defect classifying means; and means for associating said classified detected defect with said layer identification image resulting in a context-based classification of said defect.

2. The system of claim 1 wherein said means for identifying the background layers in a reference semiconductor image includes means for segmenting the background layers of said reference image and means for classifying said segmented background layers.

3. The system of claim 1 wherein said means for identifying the background layers in a reference semiconductor image includes means for extracting the hue, saturation and value levels from each pixel in said reference semiconductor image and a neural network for classifying said extracted hue, saturation and value levels.

4. The system of claim 1 wherein said background layer segmenter includes:
means for locating the edges of the semiconductor layer structures using a difference-of-Gaussians intensity gradient;
means for performing as colorspace conversion from the original red, green, blue colorspace to the excess red, green and blue colorspace; and
means for assigning all pixels within a connected edge boundary region a unique tag.

5. The system of claim 4 wherein said means for assigning all pixels within a connected edge boundary region is a means for extracting first-order statistics from the excess color values of said reference image.

6. The system of claim 4 wherein said means for assigning all pixels within a connected edge boundary region is a means for extracting fractal dimensions from the gray scale intensity of said reference image.

7. The system of claim 1 additionally including means for generating a full defect mask of said detected defect for use by said detected defect classifying means.

8. The system of claim 1 additionally including means for generating an edge defect mask of said detected defect for use by said detected defect classifying means.

9. The system of claim 1 additionally including means for generating a surround defect mask of said detected defect for use by said detected defect classifying means.

10. The system of claim 1 wherein said reference semiconductor image and said defect semiconductor images are captured in the focal plane of the semiconductor wafer surface.

11. The system of claim 1 wherein said reference semiconductor image and said defect semiconductor images are captured above the focal plane of the semiconductor wafer surface.

12. The system of claim 1 wherein said reference semiconductor image and said defect semiconductor images are captured below the focal plane of the semiconductor wafer surface.

13. The system of claim 1 wherein said means for classifying said detected defect using features of said defect includes means for extracting features using three different masks.

14. The system of claim 1 wherein said means for classifying said detected defect using features of said defect includes extracting features using three different masks at three different focus offsets.

15. A method for automatically classifying defects in a semiconductor wafer comprising the steps of:
identifying the background layers in a single reference semiconductor wafer image using a background layer identifying means resulting in a layer identification image, said step of identifying the background layers including the steps of segmenting said reference semiconductor wafer image into different physical regions, and classifying said physical regions of said reference semiconductor wafer image;
registering a defect semiconductor wafer image with respect to said reference semiconductor image and subsequently detecting a defect in said defect semiconductor image;
classifying said detected defect using features of said defect in a detected defect classifying means;
storing precomputed information in a database;
sharing information between said background layer identifying means and said detected defect classifying means via said database; and
associating said classified detected defect with said layer identification image resulting in a context-based classification of said defect.

16. The method of claim 15 wherein said step of identifying the background layers in a reference semiconductor image includes the steps of segmenting the background layers of said reference image and classifying said segmented background layers.

17. The method of claim 15 wherein said step of identifying the background layers in a reference semiconductor image includes the steps of extracting the hue, saturation and value levels from each pixel in said reference semiconductor image and classifying said extracted hue, saturation and value levels in a neural network.

18. The method of claim 15 wherein said step of segmenting said reference semiconductor wafer image into different physical regions includes the steps of:
locating the edges of the semiconductor layer structures using a difference-of-Gaussians intensity gradient;
performing a colorspace conversion from the original red, green, blue colorspace to the excess red, green and blue colorspace; and
assigning all pixels within a connected edge boundary region a unique tag.

19. The method of claim 18 wherein said step of assigning all pixels within a connected edge boundary region comprises the step of extracting first-order statistics from the excess color values of said reference image.

20. The method of claim 18 wherein said step of assigning all pixels within a connected edge boundary region comprises the step of extracting fractal dimensions from the gray scale intensity of said reference image.

21. The method of claim 15 additionally including the step of generating a full defect mask of said detected defect for use by said detected defect classifying means.

22. The method of claim 15 additionally including the step of generating an edge defect mask of said detected defect for use by said detected defect classifying means.

23. The method of claim 15 additionally including the step of generating a surround defect mask of said detected defect for use by said detected defect classifying means.

24. The method of claim 15 wherein said reference semiconductor image and said defect semiconductor images are captured in the focal plane of the semiconductor wafer surface.

25. The method of claim 15 wherein said reference semiconductor image and said defect semiconductor images are captured above the focal plane of the semiconductor wafer surface.

26. The method of claim 15 wherein said reference semiconductor image and said defect semiconductor images are captured below the focal plane of the semiconductor wafer surface.

27. The method of claim 15 wherein said step of classifying said detected defect using features of said defect includes means for extracting features using three different masks.

28. The method of claim 15 wherein said step of classifying said detected defect using features of said defect includes extracting features using three different masks at three different focus offsets.

* * * * *